United States Patent
Emoto (10) Patent No.: US 8,432,155 B2
(45) Date of Patent: *Apr. 30, 2013

(54) SIGNAL STATUS DIAGNOSING DEVICE FOR EXTERNAL CONTROL MEANS TO BE ACTIVATED WHEN FED WITH DRIVING ELECTRIC POWER BY ON/OFF SIGNAL TRANSMITTED THROUGH INSULATING MEANS

(75) Inventor: Hideaki Emoto, Tokyo (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 216 days.

This patent is subject to a terminal disclaimer.

(21) Appl. No.: 12/674,426

(22) PCT Filed: Jan. 9, 2009

(86) PCT No.: PCT/JP2009/050593
§ 371 (c)(1),
(2), (4) Date: Jun. 9, 2010

(87) PCT Pub. No.: WO2009/088097
PCT Pub. Date: Jul. 16, 2009

(65) Prior Publication Data
US 2011/0188268 A1 Aug. 4, 2011

(30) Foreign Application Priority Data
Jan. 11, 2008 (JP) .................. 2008-005077

(51) Int. Cl.
*G01R 15/18* (2006.01)
(52) U.S. Cl.
USPC ..... 324/127; 324/76.11; 324/537; 331/113 A; 336/220

(58) Field of Classification Search .................. 324/537, 324/127, 76.11
See application file for complete search history.

(56) References Cited

U.S. PATENT DOCUMENTS 4,374,330 A * 2/1983 Fey ........................ 307/132 E
2002/0053858 A1 5/2002 Hayashi et al.

FOREIGN PATENT DOCUMENTS

JP 8005708 A 1/1996
JP 3083460 U 11/2001

(Continued)

OTHER PUBLICATIONS

International Preliminary Report for PCT/JP2009/050593 mailed Aug. 19, 2010.

(Continued)

*Primary Examiner* — Jermele M Hollington
*Assistant Examiner* — Son Le
(74) *Attorney, Agent, or Firm* — Kanesaka Berner & Partners, LLP (57) ABSTRACT

A signal status diagnosing device of an external control unit, including an insulation transformer having a primary side, a secondary side and an intermediate tap at a midpoint of the primary winding, the secondary side is connected the external control unit. The device further includes a signal generating unit for generating a periodically vibrating voltage which is connected to the primary side of the insulation transformer, a switch circuit which is connected to the intermediate tap of the primary winding of the insulation transformer, the switch circuit has a switch and a resistance being connected to the intermediate tap in parallel with each other, and a current measuring unit connected to the switch circuit and configured to measure a first current which flows in the switch or the resistance to diagnose signal status of the external control unit.

4 Claims, 4 Drawing Sheets

FOREIGN PATENT DOCUMENTS

| | | |
|---|---|---|
| JP | 2002176788 A | 6/2002 |
| JP | 2003259545 A | 9/2003 |
| JP | 2004198302 A | 7/2004 |
| JP | 2006023105 A | 1/2006 |
| JP | 2007209082 A | 8/2007 |

OTHER PUBLICATIONS

International Preliminary Report for PCT/JP2009/050593 mailed Jul. 22, 2010.

ISR for PCT/JP2009/050593 mailed Apr. 21, 2009.

* cited by examiner

Transfer characteristic factor at 25°C taken as reference value

Fig. 6B

| Core material | | | PC95 |
|---|---|---|---|
| | Maker | Maker | TDK |
| | Initial permeability | $\mu i$ | 3300 |
| | Amplitude permeability | $\mu a$ | – |
| | Unit core loss | Pcv [kW/m³] | 290/@100°C |
| | Saturation magnetic flux density | Bs [nT] | 410 |
| | Residual magnetic flux density | Br [nT] | 60 |
| | Coersive force | Hc [A/m] | 6.5 |
| Core size | | | EE8 |
| | Core constant | C1 [nm⁻¹] | 2.75 |
| | Effective cross section | Ae [nm²] | 7 |
| | Effective magnetic path | Le [nm] | 19.2 |
| | Effective volume | Ve [nm³] | 134 |
| | AL value (without gap) | AL [nH/N²] | 610 |
| Type of winding frame | | | BE8-116CPHFR |
| | Cross section of widing | Aw [nm²] | 5.3 |
| | Average length of widing | Lw [nm] | 19.9 |
| | Width of widing frame | C [nm] | |
| | Number of pins | | 6 |

| | | Volume number | Peak voltage | Average voltage |
|---|---|---|---|---|
| Primary winding | P1 | 44 | 0.12 | 0.08 |
| | P2 | 44 | 0.12 | 0.08 |
| Secondary winding | S1 | 110 | 0.05 | 0.03 |

SIGNAL STATUS DIAGNOSING DEVICE FOR EXTERNAL CONTROL MEANS TO BE ACTIVATED WHEN FED WITH DRIVING ELECTRIC POWER BY ON/OFF SIGNAL TRANSMITTED THROUGH INSULATING MEANS

RELATED APPLICATIONS

The present application is national phase of PCT/JP2009/050593 filed Jan. 9, 2009, and claims priority from Japanese Application Number 2008-005077 filed Jan. 11, 2008, the disclosures of which are hereby incorporated by reference herein in their entirety.

TECHNICAL FIELD

The present invention relates to a device for diagnosing signal status of an external control means operated by driving electric power supplied upon receiving ON/OFF signal transmitted via an insulation means, particularly to a signal status diagnosing device composed such that whether signals sent to an external control means comprising actuator used to control a plant or equipment is transmitted correctly can be confirmed and soundness diagnosis of a circuit to detect whether a breaking of wire or short circuit has not occurred in the circuit.

BACKGROUND ART

Actuators has been used as external control means such as electromagnetic valves, lamps, relays, small DC motors for the purpose of controlling plants or equipment. Many of the actuators are driven by DC voltage, and the side to give instruction to the plant or equipment (hereafter referred to as the instruction side) is insulated from the side to perform measurement, drive, or control in the plant or equipment (hereafter referred to as the plant side) for the purpose of preventing affections on the human body or evading affections of noise depending on use. Signals sent from the instruction side and signals of measurement result sent from the plant side to the instruction side are insulated by photocouplers, signal insulation relays, insulation amplifiers, and insulation transformer. When electric power is needed, insulation transformer is adopted for the electric power source.

In recent years, there has been an increased demand for performing soundness diagnosis of circuit in the field of instrumentation and measurement for the purpose of raising reliability of the system by confirming soundness of output signals and circuit wiring, that is, by confirming whether actuators such as electromagnetic valves, lamps, relays, and small DC motors are operating correctly as instructed and whether there is a breaking of wire or short circuit occurred in the circuit.

Figure 7:
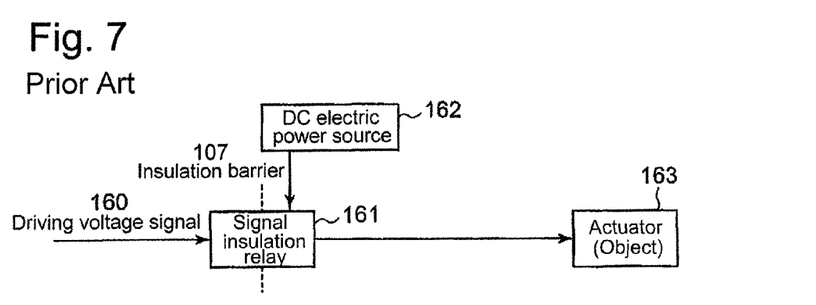
FIG. 7 is a block diagram of a conventional circuit for driving an object which is an actuator such as an electromagnetic valve, lamp, relay, and small DC motor.
Figure 8:
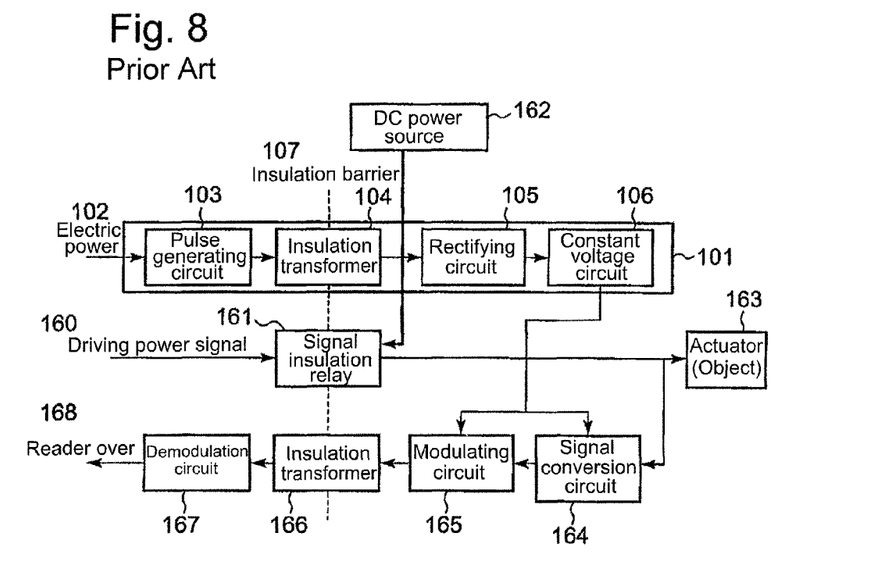
FIG. 8 is a block diagram of a conventional circuit provided with a circuit for performing diagnosis of signal status, for driving an actuator such as an electromagnetic valve which is fully opened or fully closed upon receiving voltage signal, or a servo valve of the which opening is controlled between fully opened state and fully closed state in accordance with the voltage of a voltage signal.

FIG. 7 and FIG. 8 respectively shows an example of conventional drive circuit of an external control means consisting of an actuator such as an electromagnetic valve, lamp, relay, small DC motor, and that added with a circuit for diagnosing soundness of the drive circuit.

In FIG. 7, reference numeral 160 is a driving voltage signal for driving an actuator 163 such as an electromagnetic valve, lamp, relay, small DC motor (hereafter referred to as the object depending on circumstances), 161 is a signal insulation relay for insulating the plant side from the instruction side, and 162 is a DC electric power source for driving the actuator.

In FIG. 8, reference numeral 101 is an electric power source circuit for supplying electric power to a signal conversion circuit for current detection, 164 and modulating circuit 165. The power source circuit consists of a pulse generating circuit 103 for converting the electric power from the electric power source 102 into a pulse voltage, an insulation transformer 104 for transforming the voltage of the pulse voltage from the pulse generating circuit 103 and insulating the plant side from the instruction side, a rectifying circuit 105 for rectifying the pulse transformed by the insulation transformer 104, and a constant voltage circuit 106 for smoothing and rendering the rectified pulse into a constant voltage. A broken line denoted by reference numeral 107 indicates an insulation barrier. Reference numeral 164 is a signal conversion circuit for current detection, 165 is a modulating circuit, 166 is an insulation transformer, 167 is a demodulation circuit, and 168 is a read over current signal.

The driving voltage signal 160 in FIG. 7 is inputted to the signal insulation relay for insulating the signal, and electric power sent from the DC power source 162 provided separately is sent to the object 163, an actuator such as an electromagnetic valve lamp, relay, and small DC motor to drive it.

In the circuit provided with a circuit for performing soundness diagnosis shown in FIG. 8, it is similar as in the case of FIG. 7 that the DC power source 162 is provided to send electric power via the signal insulation relay 161 to the actuator (object) 163 to drive it. However, in the circuit of FIG. 8, there are provided an insulation amplifier consisting of the signal conversion circuit 164 for detecting the current in the actuator 163, modulating circuit 165 for converting the detected current into voltage, insulation transformer 166, and demodulating circuit 167 for converting the voltage signal into a current signal; and an electric power source circuit 101 consisting of the electric power 102, pulse generating circuit 103, insulating transformer 104, rectifying circuit 105, and constant voltage circuit 106; for the purpose of diagnosing the soundness of circuit such as whether the actuator 163 is operating as instructed and whether there is breaking of wire or short circuit occurred in the circuit.

The driving voltage signal 160 is inputted to the signal insulation relay 161 for insulating the signal to switch on the signal insulation relay 161, and electric power sent from the DC electric power source 162 is sent to the actuator (object) such as an electromagnetic valves, lamp, relay, and small DC motor to drive it, similarly to the case of FIG. 7. A current sent from the DC power source 162 via the signal insulation relay 161 is detected by the signal conversion circuit for current detection 164 and converted into a voltage signal, the voltage signal is modulated by the modulating circuit 165 to be converted into a modulated voltage signal (alternating voltage signal) and sent to the insulation transformer 166, then converted into a current signal by the demodulating circuit 167 in the instruction side, thus the current flown to the object 163 is outputted from the demodulation circuit 167 as a read over 168.

That is the conventional circuit provided with the function of diagnosing the soundness of circuit such as whether the actuator such as an electromagnetic valve, lamp, relay, and small DC motor used for the purpose of controlling a plant or equipment is operating as instructed, and whether there is a breaking of wire or short circuit occurred. With this conventional circuit construction for diagnosing operation status of the external control means, there have been problems as follows:

(A) An electric power source circuit and soundness diagnosing circuit must be added to perform soundness diagnosis separately from the circuit for transmitting the signal for driving the actuator, so, the number of parts increases and circuit construction becomes complicated, resulting in increased manufacturing cost.

(B) It is necessary to provide an additional circuit such as an excess current detecting circuit for the purpose of detecting occurrence of abnormality, and further to provide separately a safeguard such as a circuit protector or fuse against excess current flow.

Therefore, when intending to perform soundness diagnosis, it is inevitable with the conventional system that manufacturing cost is seriously increased, and the conventional system can not be adopted unless there is a strong demand to increase reliability in spite of increasing of manufacturing cost.

As to the art for detect braking of wire, there are disclosed for example in patent literature 1 (Japanese Laid-Open Patent Application No. 2006-023105) a method of detecting breaking of wire by applying a pulse signal to the wire, and comparing the current wave shape measured with the reference current wave shape to judge the presence or absence of breaking of wire from difference in both the wave shapes, and in patent literature 2 (Japanese Laid-Open Patent Application No. 2004-198302) a circuit for detecting breaking of wire by applying a pulse signal for checking via an impedance component to the signal wire for detecting breaking of wire, and comparing the signal obtained from the signal wire with the pulse signal for checking to judge the presence or absence of breaking of wire.

As to diagnosis of electric circuits, there is disclosed for example in patent literature 3 (Japanese Laid-Open Patent Application No. 8-005708) a method of diagnosing electric circuits and diagnosing device used for the method. With the method, conditions of electric apparatuses are diagnosed for the purpose of improving efficiency of diagnosis operation by facilitating measurement record management and further decreasing occurrence of man-caused errors, by reading out information written and stored in a nonvolatile memory concerning measurement results of characteristics or things concerning measurement of the electric apparatuses, or measurement results of characteristics or things concerning measurement of the electric apparatuses, and comparing the read-out information with the information of-the-moment concerning measurement results of characteristics or things concerning measurement of the electric apparatuses.

However, with the art taught in the patent literature 1 and 2 which relates to a detection of a breaking of wire in a circuit, means for applying pulse signals and a memory for memorizing reference current wave shape are needed, and with the electric circuit diagnosing device disclosed in the patent literature 3, a memory memorized information concerning measurement results of characteristics or things concerning measurement of the electric apparatuses is needed, and further a means for measuring characteristics of the circuit and a means for comparing the measurement result with the reference data, resulting in complicated composition. Therefore, problems cited in the items (A) and (B) cannot be solved by these arts.

SUMMARY OF THE INVENTION

Therefore, the object of the present invention is to provide a device for diagnosing signal status of an external control means, with which a signal showing operation status of the driven object, an external control means, or occurrence of a breaking of wire or short circuit, is transmitted by the same means for transmitting the electric power, and transmission of measurement result and diagnosis of soundness of the circuit can be performed with high accuracy by simple construction without increase of the number of parts and complication of the circuitry, thereby preventing increase in manufacturing cost.

To attain the object, the present invention proposes a signal status diagnosing device of an external control means which operates with driving power supplied by an ON/OFF signal transmitted via an insulation means, comprising an insulation transformer having an intermediate tap at a midpoint of its primary winding as said insulation means, to the secondary side of which being connected said external control means; a signal generating means for generating a periodically vibrating voltage including a rectangular pulse voltage and alternating voltage connected to the primary side of the insulation transformer; a switch circuit connected to the intermediate tap of the primary winding of the insulation transformer and operated by an ON/OFF signal to send a driving electric power to the external control means to drive the same; and a current measuring means connected to the intermediate tap to measure a current which flows in the primary side of the insulation transformer corresponding to a current which flows in the secondary side thereof to be supplied to the external control means to drive the same; whereby signal status of the external control means is diagnosed based on the measurement result of the current measuring means.

With the device, the switch circuit which is connected to the intermediate tap provided to the primary winding of the insulation transformer and allows electric power for driving the external control means to be supplied in accordance with an ON/OFF signal, is provided; change in the primary current caused by the consumption of electric power by the external control means, is measured, which electric power being sent from the primary side of the insulation transformer via the secondary side thereof; signal status of the external control means can be diagnosed beads on the measurement result; and thus the supply of electric power and diagnosis of operation status of the external control means can be performed by the same circuit.

Therefore, a device for diagnosing signal status of an external control means can be composed which needs not to provide an insulation means such as an insulation electric power source and insulation transformer, signal conversion circuit, demodulating circuit, etc. as cited in the item (A) and (B) as is needed in the conventional device; is very simple in construction without increase in the number of part preventing increase of manufacturing cost; and can diagnose operation status of the external control means with high accuracy.

By composing such that the switch circuit switches on/off the signal generating means in accordance with the ON/OFF signal of the external control means, and that the switch circuit is composed so that it allows weak electric power not able to drive the external control means to be outputted from the secondary side of the insulation transformer with "OFF" signal of the external control means, current is not measured when a braking of wire occurs in the external control means, when a short circuit occurs, a current larger than usual flows and correspondingly larger current flows in the primary side of the insulation transformer and is measured, so, ON/OFF status of the external control means, a braking of wire or short circuit can be estimated. Therefore, a signal status diagnosing device can be provided with which occurrence of breaking of wire and short circuit can be always monitored.

As has been described heretofore, according to the invention, a device for diagnosing signal status of an external control means can be composed which needs not to provide an electric power source, insulation means, signal conversion means, demodulating circuit, etc. for every external control means as is needed in the conventional device; is very simple in construction without increase in the number of part preventing increase of manufacturing cost; and can diagnose operation status of the external control means with high accuracy.

DETAILED DESCRIPTION OF THE PREFERRED EMBODIMENTS

A preferred embodiment of the present invention will now be detailed with reference to the accompanying drawings. It is intended, however, that unless particularly specified, dimensions, materials, relative positions and so forth of the constituent parts in the embodiments shall be interpreted as illustrative only not as limitative of the scope of the present invention.

Figure 1:
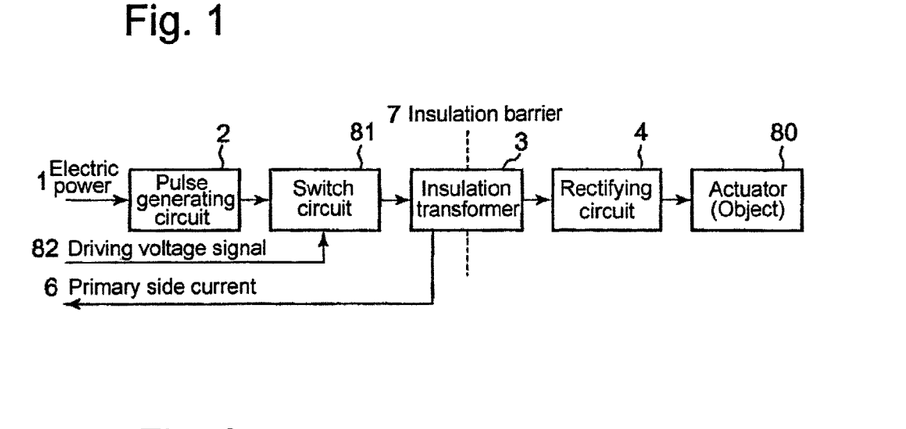
FIG. 1 is a block diagram of a circuit according to the invention for driving an actuator such as an electromagnetic valve, lamp, relay, small DC motor, etc., which is supplied or cut-off with electric power to drive it upon receiving an ON/OFF signal.
Figure 2:
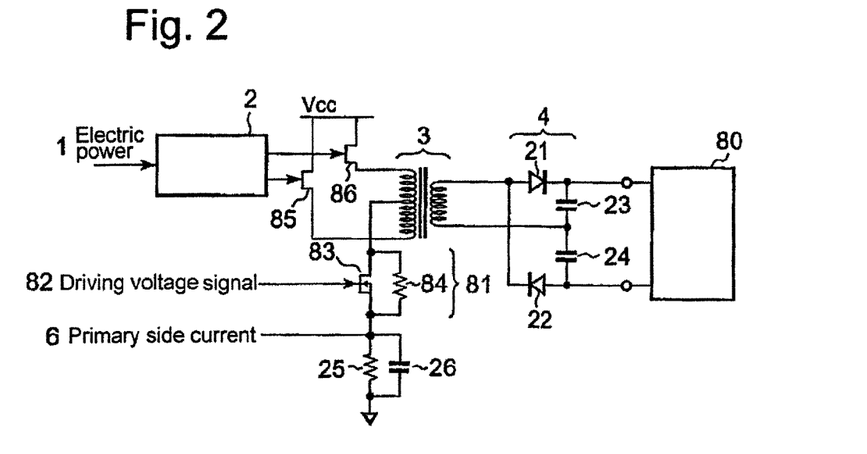
FIG. 2 is a diagram of a circuitry according to the invention for driving an actuator such as an electromagnetic valve, lamp, relay, small DC motor, etc., which is supplied or cut-off with electric power to drive it upon receiving an ON/OFF signal.
Figure 3:
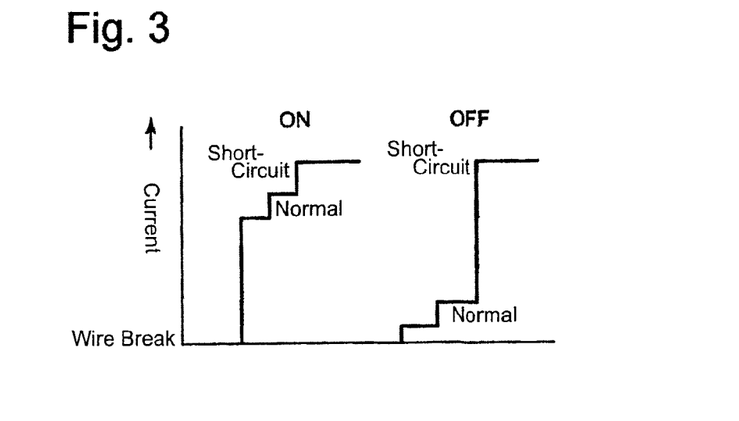
FIG. 3 is a graph showing current value in an actuator which is supplied or cut-off with electric power to drive it upon receiving an ON/OFF signal when the actuator operates normally, when breaking of wire has occurred, and when short-circuit has occurred.

FIGS. 1, 2, and 3 is respectively a block diagram (FIG. 1) of a signal status diagnosing device of the invention for confirming whether a signal is transmitted correctly to an external control means driven with electric power supplied such as an actuator like an electromagnetic valve, lamp, relay, and small DC motor via an insulation means and whether there is a breaking of wire or short circuit occurred in the circuit; a concrete circuit diagram (FIG. 2); and current flow (FIG. 3) in the object 80, an actuator, in the circuit shown in FIG. 1, 2, depending on conditions such as operation status of the actuator, occurrence of breaking of wire or short circuit.

In FIG. 1, reference numeral 1 is an electric power source, 2 is a pulse generating circuit, 3 is an insulation transformer, 4 is a rectifying circuit, 6 is primary side current of the insulation transformer 3, a broken line 7 indicates an insulation barrier. Reference numeral 80 is an actuator (hereafter referred to as the object depending on circumstances) as an external control means such as an electromagnetic valve, lamp, relay and small DC motor driven with electric power supplied in accordance of an ON/OFF signal, 81 is a switch circuit comprising FET (83 in FIG. 2), and 82 is a driving voltage signal for driving the actuator 80.

In FIG. 2, reference numeral 21 and 22 is a diode composing the rectifying circuit 4, 23 and 24 is a condenser composing the rectifying circuit 4, 26 is a condenser, 25 and 84 is a resistance, 83 is a FET switched on/off by the driving voltage signal 82, 85 and 86 is a FET for applying pulse voltage to both the ends of the primary winging of the insulation transformer alternately.

In FIG. 3, a stepped solid line in the left with a letter "ON" above it shows the value of the current signal 6 when the actuator 80 is in a state of ON, and a stepped solid line in the right with a letter "OFF" above it shows the value of the current signal 6 when the actuator 80 is in a state of OFF. The solid lines are stepped only for the purpose of sectioning the ranges clearly. In the graph, range of current flowing to the actuator 80 when it is operating normally is indicated by "NORMAL" in both cases of ON and OFF of the state of the actuator 80, that when there is breaking of wire is indicated by "WIRE BREAK", and that when there is a short-circuit is indicated by "SHORT-CIRCUIT".

First, referring to FIG. 1 showing a block diagram, the switch circuit 81 supplied with a pulse from the pulse generating circuit 2 supplied with the electric power 1 is switched on/off by the driving voltage ON/OFF signal 82 to supply a voltage sufficient to drive the actuator and a voltage insufficient to drive the actuator to the insulation transformer 3 in accordance with the ON/OFF signal. In this way, the actuator 80 is supplied with electric power of 10~20 W from the insulation transformer 3 via the rectifying circuit 4 when the driving voltage signal 82 is "ON", and supplied with electric power short of for driving the actuator 80 when said signal is "OFF".

Therefore, current for driving the actuator 80 flows in the secondary side of the transformer 3, and a current corresponding to the current flowing in the secondary side flows in the primary side of the insulation transformer 3. By measuring the primary side current by an ammeter not shown in the drawing, a current consumed by the actuator can be estimated, and further whether there is a breaking of wire or short circuit occurred in the circuit can be judged by that current does not flow or excessive current flows in the primary side respectively.

Next, referring to FIG. 2 showing a concrete circuitry, diodes 21, 22, and condensers 23, 24 are connected to the secondary side of the insulation transformer 3 to compose a full wave rectifying circuit 4, to the output side of which is connected the actuator 80. In primary side of the insulation transformer 3, a pulse from the pulse generating circuit 2 driven by the electric power supplied from the power source 1 is inputted to the FET's 85 and 86 supplied with electric power from the power source $V_{cc}$, and the voltage $V_{cc}$ is applied to both the ends of the primary winding alternately by switching on of each FET. An intermediate tap is provided at the midpoint of the primary winding of the insulation transformer 3, the FET with the resistance 84 connected in parallel thereto composing the switch circuit 81 is connected to the intermediate tap, and the resistance 25 with the condenser connected in parallel is connected to the switch circuit.

The pulse generating circuit 2 generates a rectangular wave pulse with electric power supplied from the power source 1, and the voltage $V_{cc}$ is applied alternately to both the ends of the primary winding of the insulation transformer 3 via the FET's 85 and 86. The FET 83 is switched on when "ON" signal of the driving voltage signal 82 is applied to the FET 83 in the switch circuit 81, and a current determined depending on the resistance 25 flows in the primary side of the insulation transformer. From the secondary side thereof flows out a voltage increased in pressure, which is rectified by the rectifying circuit 4 composed of the diodes 21, 22 and condensers 23, 24, and the rectified DC current is supplied to the actuator 80 to drive it.

In the primary side of the insulation transformer 3 flows a current corresponding to the current which flows in the secondary side thereof to drive the actuator 80, so, by measuring this primary side current by an ammeter not shown in the drawing, the current actually used to drive the actuator 80 is estimated based on the measurement result. In this way, the current used to drive the actuator 80 such as an electromagnetic valve, lamp, relay, and small DC motor is estimated and signal status diagnosing of the external control means can be performed with high accuracy, without the need of providing an electric power source, soundness diagnosing circuit, and an additional circuit for detecting excessive current, separately from the circuit for transmitting the ON/OFF signal for operating the actuator, as is deeded in the conventional circuit.

When the driving voltage signal 82 is "OFF", the FET composing the switch circuit 81 is switched off, current flows through the resistance 84 and resistance 25, and the voltage applied to the primary side of the insulation transformer 3 becomes constant. Therefore, even when the driving voltage signal 82 is "OFF", a voltage with which the actuator 80 is not driven is produced in the secondary side of the insulation transformer 3. Therefore, when the current signal 6 does not flow, it is thought that there occurred a braking of wire, and when the current 6 is large beyond expectation, it is thought that there occurred a short circuit.

FIG. 3 shows how the current 6 becomes in those cases. Value of the current 6 is shown as the ordinate and cases when driving voltage signal 82 is "ON" and "OFF" are ranged along the abscissa. When the driving voltage signal 82 is "ON", the FET 83 is switched on as mentioned above, a current determined depending on the resistance 25 flows to the primary side of the insulation transformer 3 and in the secondary side thereof flows a current in the range of "Normal" in the left side graph of FIG. 3. When the driving voltage signal 82 is "OFF, the FET 83 is switched off as mentioned above, so, the current flows to the primary side of the insulation transformer 3 passes through the both the resistances 84 and 25, and accordingly in the secondary side thereof flows a small current in the range of "Normal" in the right side graph of FIG. 3, with which current the actuator 80 can no be driven. When there occurs a short circuit, a large current flows in the circuit as shown by "short circuit" in both cases of "ON" and "OFF" of the driving voltage signal 82. When there is a breaking of wire, even weak current does not flow, and so nearly no current flows as shown by "BREAKING OF WIRE" in FIG. 3.

As has been described above, according to the invention, the current used to drive the actuator 80 is estimated based on the current which flows in the primary side of the insulation transformer 3 corresponding to the current which flows in the secondary side thereof, and at the same time a braking of wire and short circuit can be diagnosed by flowing always a weak current in the circuit.

When performing driving of driven object and diagnosing of the circuit using the electric power source not provided with the constant voltage circuit in this way, particularly in the case of analog signal transmission, there arises a problem of accuracy. Particularly, in the circuit system like this, energy loss in the insulation transformer becomes an error for the transmitted energy. However, when the error in the signal transmission is smaller than a required accuracy range, there is no problem. For example, when error of about 0.2%~0.25% is permissible, conventional transformer can be adopted.

When more precision is required, for example, error must be smaller than 0.1%, change of core loss depending on temperature of the transformer becomes most problematic. However, when the core loss is nearly constant in relation to temperature, it is no matter to judge the measurement result with high accuracy taking temperature into consideration, and measurement and transfer of analog signals is made possible with high accuracy.

Figure 4:
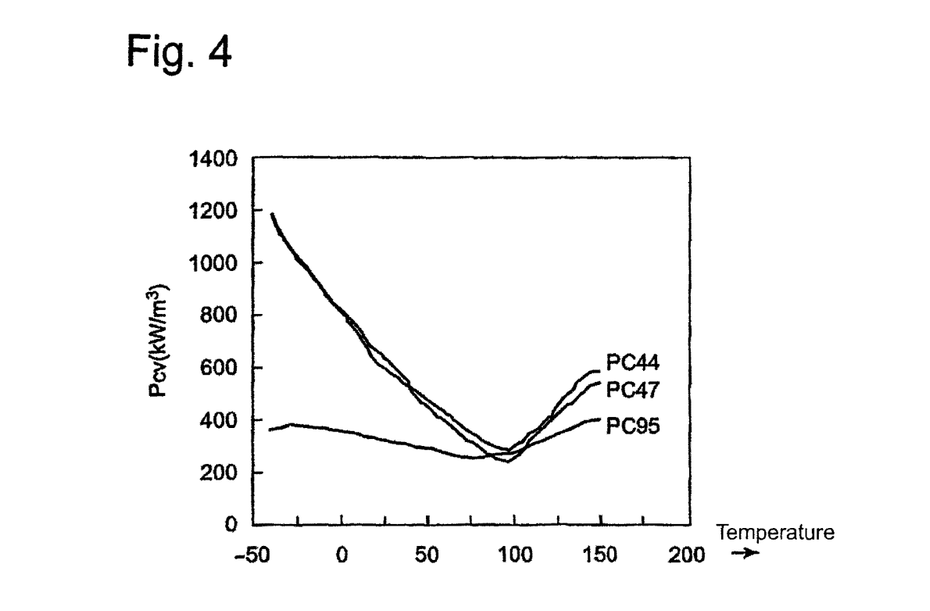
FIG. 4 is a graph showing core loss (electric power loss) vs. temperature characteristic of the core material used in the transformer of the invention.

FIG. 4 is a graph showing core loss characteristic (loss power ($kW/cm^3$) vs. temperature (° C.)) of several core materials. Core materials PC44 and PC47 of TDK Ltd. made which has a peak value at near 100° C.; however, PC95 also of TDK Ltd. made has a relatively flat core loss characteristic. In the invention, PC95 was adopted as the core material of the insulation transformer. By this, a signal status diagnosing device can be provided which performs diagnosis of the status of signals in the measurement and control means in the driven object with high accuracy.

Figure 5:
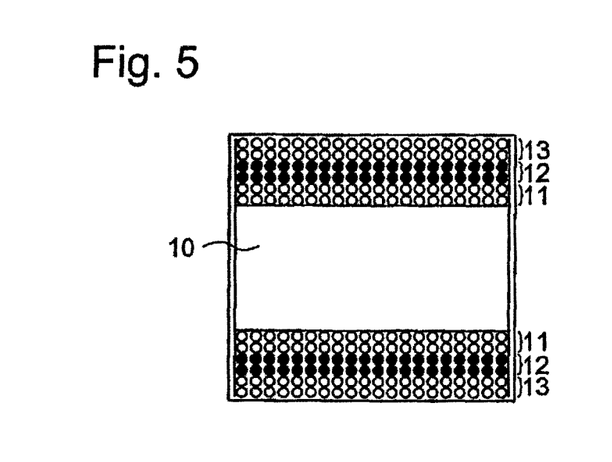
FIG. 5 is a pattern diagram showing winding of the primary and secondary coil around the core of the transformer used in the invention.

Further, the inventors of the application composed a transformer such that an intermediate tap is provided in an intermediate part of the primary winding, a current measuring means is connected to the intermediate tap, and change of primary side current caused by consumption of current supplied to the secondary side. As shown in FIG. 5, the primary coil is divided into an anterior half 11 and posterior half 13 such that a secondary coil 12 is sandwiched by both the primary coil 11 and 13, and the intermediate tap is taken out from the center of the primary coil. The inventors found out that a favorable signal transfer characteristic can be obtained with this composition of a transformer using PC95 as core material.

Figure 6A:
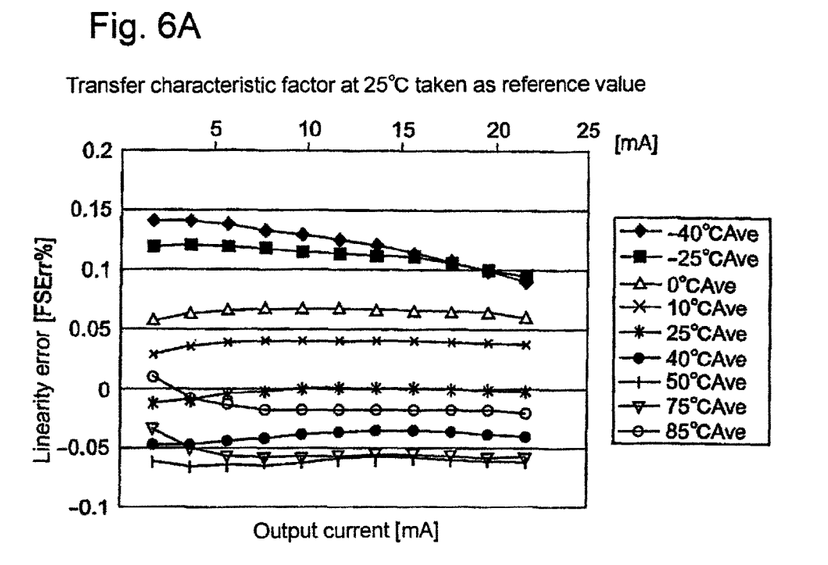
FIG. 6A is a graph of a test result showing linearity error of transfer characteristic of the transformer used in the invention (linearity error for various core temperature between −40~85° C. taking the transfer characterization factor at 25° C. as the reference value)

FIG. 6A is a graph showing a test result. The test was performed composing a distributor-isolation-amplifier using a insulation transformer composed using PC95 of TDK made as core material and arranging primary and secondary windings as shown in FIG. 5. Linearity and temperature drift were measured.

Figure 6B:
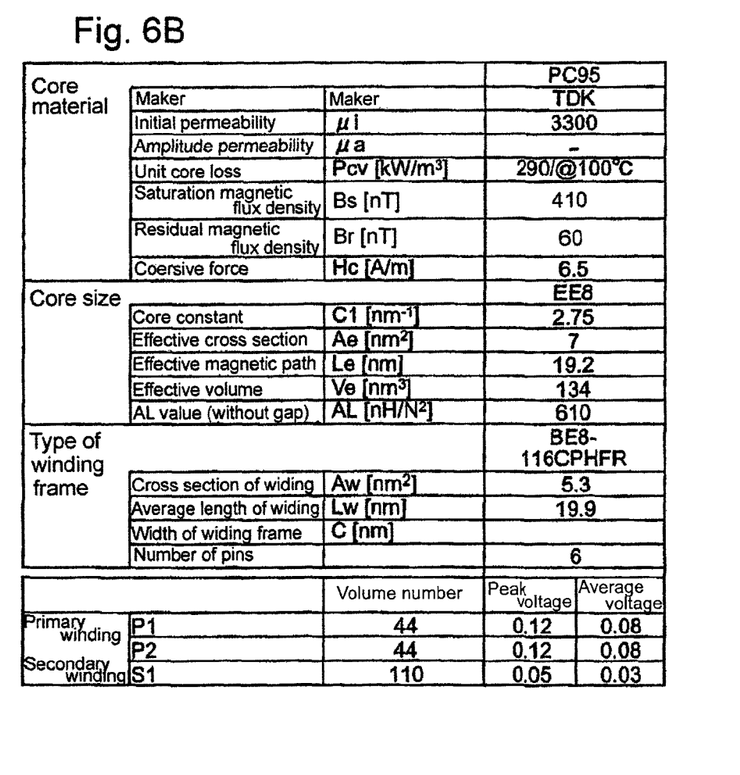
FIG. 6B is table showing the specifications of the transformer used in the test.

Specification of the insulation transformer used in the test is shown in the table of FIG. 6B. Measurement was performed using a precision resistance of accuracy of 10 ppm/° C.

In FIG. 6A is shown linearity errors of transfer characteristics for temperatures between −40~85° C., in which output currents (mA) of the distributor-isolation-amplifier are plotted as the abscissa and full scale errors % (4~20 mA is taken as 100%) are plotted as the ordinate, with the transfer characteristic factor at 25° C. taken as the reference value.

In the case of the conventional transformer composed by using PC44 or PC47 as core material to have a single primary coil not divided in two as shown in FIG. 5 and a secondary coil wound over the primary coil, linearity is ±0.05% or smaller, and about ±0.25% under environment of 0~60° C. Therefore, as can be recognized from FIG. 6A that, by composing the insulation transformer as described before, linearity of ±0.01% or smaller, about ±0.1% under environment of 0~85°

C., and about 0.15%~–0.1% under environment of –40~85° C. can be attained. It is thinkable that further improvement in accuracy and temperature characteristic can be attained by innovations in shape and size and increase of the number of winding of the insulation transformer.

Industrial Applicability

According to the invention, confirming the operation of the a external control means such as an actuator like as electromagnetic valve, lamp, relay, and small DC motor and diagnosing the soundness of circuit, can be implemented with simple construction and without increase in the number of constituent elements, complication of the circuit configuration, and increase in manufacturing cost. The invention can be applied easily to an electric circuit which is required particularly to be highly reliable.

The invention claimed is:

1. A signal status diagnosing device of an external control unit, said device comprising:
   an insulation transformer having a primary side, a secondary side and an intermediate tap at a midpoint of a primary winding on the primary side, the secondary side connected to said external control unit,
   a signal generating unit for generating a periodically vibrating voltage including a rectangular pulse voltage and an alternating voltage, the signal generating unit connected to the primary side of the insulation transformer,
   a switch circuit which is connected to the intermediate tap of the primary winding of the insulation transformer and is configured to convert an output of the signal generating unit into a voltage for switching ON/OFF the external control unit and to send a driving electric power to the external control unit to drive the external control unit, the switch circuit having a switch and a resistance, the switch and the resistance being connected to the intermediate tap in parallel with each other, and
   a current measuring unit connected to the switch circuit and configured to measure a first current which flows in the switch or the resistance corresponding to a second current which flows in the secondary side of the insulation transformer, wherein the first current is used to diagnose signal status of the external control unit.

2. A signal status diagnosing device according to claim 1, wherein said switch circuit is configured to turn ON/OFF said signal generating unit in order to send an ON/OFF signal to the external control unit.

3. A signal status diagnosing device according to claim 1, wherein said switch circuit is configured to output weak electric power insufficient to drive the external control unit from the secondary side of the insulation transformer when an "OFF" signal is sent to the external control unit.

4. A signal status diagnosing device according to claim 1, wherein
   the insulation transformer comprises a core, a primary coil as the primary winding on the primary side, and a secondary coil on the secondary side,
   the primary coil includes a first part between one end of the primary coil and the intermediate tap, and a second part between another end of the primary coil and the intermediate tap, and
   the secondary coil is winded around the core and is sandwiched between the first part and the second part of the primary coil.

* * * * *